United States Patent
Xiang

(12) 
(10) Patent No.: US 6,809,016 B1
(45) Date of Patent: Oct. 26, 2004

(54) DIFFUSION STOP IMPLANTS TO SUPPRESS AS PUNCH-THROUGH IN SIGE

(75) Inventor: Qi Xiang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/379,794

(22) Filed: Mar. 6, 2003

(51) Int. Cl.[7] .................................................. H01L 21/38

(52) U.S. Cl. ........................ 438/556; 438/922; 438/923; 438/933; 438/FOR 486; 257/E31.035

(58) Field of Search .................................. 438/922, 923, 438/933, FOR 486, 522, 527, 530, 543, 545, 6, 9, 555–556; 257/E31.035

(56) References Cited

U.S. PATENT DOCUMENTS

| | | | | |
|---|---|---|---|---|
| 6,080,614 A | * | 6/2000 | Neilson et al. | 438/238 |
| 6,380,036 B1 | * | 4/2002 | Oda et al. | 438/289 |
| 6,472,281 B2 | * | 10/2002 | Doi et al. | 438/305 |
| 6,670,682 B1 | * | 12/2003 | Mouli | 257/385 |
| 6,723,621 B1 | * | 4/2004 | Cardone et al. | 438/478 |
| 2003/0062537 A1 | * | 4/2003 | Sugii et al. | 257/192 |

\* cited by examiner

*Primary Examiner*—George Fourson
*Assistant Examiner*—Thanh V Pham

(57) ABSTRACT

Diffusion of As in SiGe of MOS transistors based on Si/SiGe is prevented by ion implanting boron. Embodiments include forming As source/drain extension implants in a strained Si/SiGe substrate, ion implanting boron at between the As source/drain extension implant junctions and subsequently annealing to activate the As source/drain extensions, thereby preventing distortion of the originally formed junction.

15 Claims, 4 Drawing Sheets

DIFFUSION STOP IMPLANTS TO SUPPRESS AS PUNCH-THROUGH IN SIGE

FIELD OF THE INVENTION

The present invention relates generally to high speed, high performance MOS semiconductor devices, particularly NMOS transistors, fabricated on strained lattice semiconductor substrates. The present invention has particular applicability in fabricating NMOS transistors on strained lattice semiconductor substrates having reduced punch-through in the silicon-geranium (SiGe) layer.

BACKGROUND OF THE INVENTION

The increasing demand for micro-miniaturization requires scaling down various horizontal and vertical dimensions of various device structures. Smaller devices typically equate to faster switching times which lead to faster devices with high performance. Source/drain extensions with abrupt junctions/dopant profile slopes in proximity to the transistor channel are required to reduce penetration of the source/drain dopant into the transistor channel which occurs as the junction/profile slope becomes less abrupt. Such short channel effects result in poor threshold voltage roll-off characteristics for submicron devices.

Attempts to fabricate semiconductor with higher operating speeds, enhanced performance characteristics, and lower power consumption have led to the development of "strained silicon". According to this approach, a very thin, tensilely strained, crystalline silicon (Si) layer is grown on a relaxed, graded composition of SiGe buffer layer several microns thick, which SiGe buffer layer is, in turn, formed on a suitable crystalline substrate, e.g., a Si wafer or a silicon-on-insulator (SOI) wafer. The SiGi layer typically contains about 0.15 to 0.25 at % Ge. Strained Si technology is based upon the tendency of the Si atoms, when deposited on the SiGe buffer layer, to align with the greater lattice constant (spacing) of the Si and Ge atoms therein (relative to pure Si). As a consequence of the Si atoms being deposited on the SiGe substrate comprised of atoms which are spaced further apart than in pure Si, they "stretch" to align with the underlying lattice of Si and Ge atoms, thereby "stretching" or tensilely straining the deposited Si layer. Electrons and holes in such strained Si layers have greater mobility than in conventional, relaxed Si layers with smaller inter-atom spacings, i.e., there is less resistance to electron and/or hole flow. For example, electron flow in strained Si may be up to about 70% faster compared to electron flow in conventional Si. Transistors and IC devices formed with such strained Si layers can exhibit operating speeds up to about 35% faster than those of equivalent devices formed with conventional Si, without necessity for reduction in transistor size.

In attempting to fabricate NMOS devices on strained silicon substrates using arsenic (As) as the dopant, punch-through difficulties have been encountered, primarily because As exhibits very rapid diffusion in SiGe vis-à-vis Si. Such rapid diffusion undesirably distorts the originally formed junction shape generating short channel effects.

Accordingly, a need exists for methodology enabling the fabrication of semiconductor devices based on strained silicon substrates having reduced short channel effects, notably punch-through in the SiGe layer. There exists a particular need for methodology enabling the fabrication of NMOS transistors implanted with As and having reduced short channel effects.

DISCLOSURE OF THE INVENTION

An advantage of the present invention is a method of manufacturing a semiconductor device having an NMOS transistor doped with As over a strained silicon substrate having reduced short channel effects.

Another advantage of the present invention is a semiconductor device having an NMOS transistor doped with arsenic on a strained silicon substrate having reduced short channel effects.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointing out in the appended claims.

According to the present invention, the foregoing and other advantages are achieved by a method of manufacturing a semiconductor device, the method comprising: forming a substrate comprising a semiconductor layer of silicon (Si) having a strained lattice on a layer of silicon-germanium (SiGe); forming a gate electrode, with side surfaces, on an upper surface of the substrate with a gate dielectric layer therebetween; ion implanting arsenic (As) into the substrate to form source/drain extension implants having junctions with the strained Si and SiGe layers under the side surfaces of the gate electrode; ion implanting boron impurities into the substrate at the junctions to form diffusion stop implants which inhibit diffusion of As; and heating to form activated As source/drain extensions, wherein the diffusion stop implants prevent As diffusion during heating.

Embodiments of the present invention comprise ion implanting boron ions at an angle of 10° to 45° with respect to a line perpendicular to the substrate surface to form the diffusion stop implants either before or after forming the As source/drain extensions implants. Sidewall spacers are then formed on the side surfaces of the gate electrode and deep As source/drain implants are formed. Annealing is then conducted, as at a temperature 1000° C. to 1100° C. for 1 second to 10 seconds, to activate the As source/drain extensions and deep As source/drain regions.

Another aspect of the present invention is a semiconductor device having an N-channel resistor comprising: a substrate comprising a semiconductor layer of silicon (Si) having a strained lattice on a layer of silicon-germanium (SiGe); a gate electrode, with side surfaces, on an upper surface of the substrate with a gate dielectric layer therebetween; source/drain extensions containing arsenic (As) in the substrate having junctions with the strained Si and SiGe layers under the side surfaces of the gate electrode; and diffusion stop implants containing boron at the junctions. Embodiments include such semiconductor devices wherein the diffusion stop implants contain boron at a concentration of $5 \times 10^{17}$ to $1 \times 10^{19}$ atoms/cm$^3$.

Additional advantages and aspects of the present invention will become readily apparent to those skilled in the art from the following detailed description, wherein embodiments of the present invention are shown and described, simply by way of illustration of the best mode contemplated for practicing the present invention. As will be realized, the present invention is capable of other and different embodiments, and its several details are susceptible of modification in various obvious respects. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the various features are not necessarily drawn to scale but rather are drawn as to best illustrate the pertinent features, wherein:

In FIGS. 2 through 4, similar features are denoted by similar reference characters.

DESCRIPTION OF THE INVENTION

The present invention addresses and solves the punch-through problem of As in source/drain extensions having junctions in a SiGe layer underlying a layer of strained Si in NMOS transistors. Such punch-through is believed to occur, in part, because the diffusion rate of As in SiGe is greater than the diffusion rate of As in the overlying strained Si layer.

Figure 1:
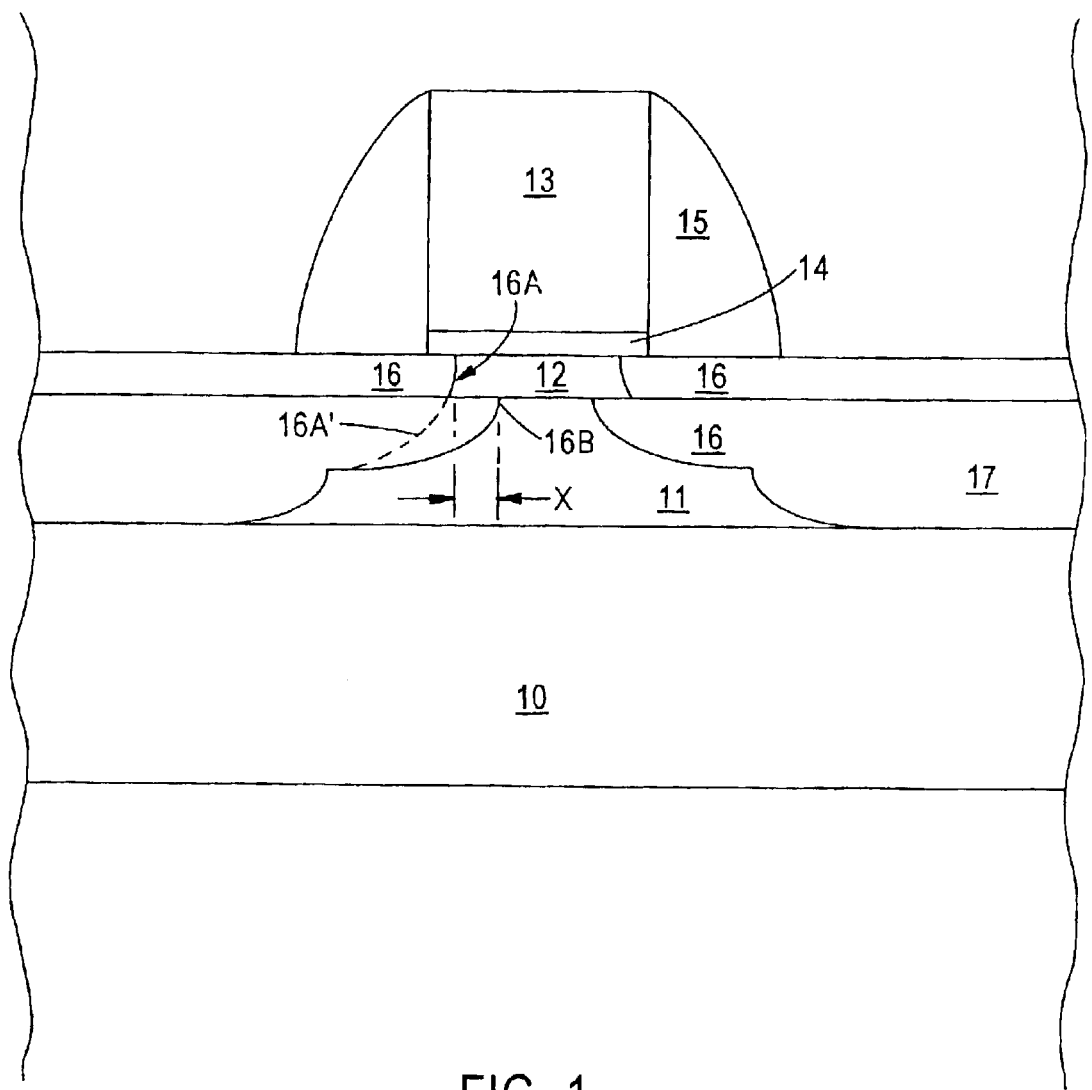
FIG. 1 schematically illustrates the junction diffusion problem addressed and solved by the present invention.

Adverting to FIG. 1, a conventional device is schematically illustrated and comprises a basic substrate 10, such as a Si wafer, a layer of SiGe 11 and a strained Si layer 12 sequentially formed on substrate 10. A gate electrode 13 is formed over the upper surface of the silicon layer 12 with a gate dielectric layer 14 therebetween. Dielectric sidewall spacers 15, typically silicon nitride, are formed on side surfaces gate electrode 13. The depicted device comprises As source/drain extensions 16 and As deep source/drain regions 17. Upon initially implanting As to form the source/drain extension implants, a junction 16A is formed in strained Si layer 12 extending into SiGe layer 11 as shown by broken line 16A'. However, upon thermal annealing to activate the source/drain extensions, the originally formed junction 16A becomes distorted due to the rapid diffusion of As in the SiGe layer 11 vis-à-vis the strained silicon layer 12, such that the originally formed junction 16A moves toward the channel region forming distorted junction 16B which is offset from original junction 16A by a distance X, typically 50 Å to 500 Å. The distortion of the originally formed source/drain extensions because of the rapid diffusion of As generates various short channel effects, notably punch-through.

The present invention addresses and solves that problem by strategically implanting boron impurities, such as B or $BF_2$, to form a diffusion stop implant at the desired junction, either before or after implanting As to form the As source/drain extension. It was found that the formation of such counter doped implants effectively inhibit diffusion of the implanted As, thereby preventing distortion of the originally formed junction in the SiGe layer and hence, preventing punch-through.

Figure 2:
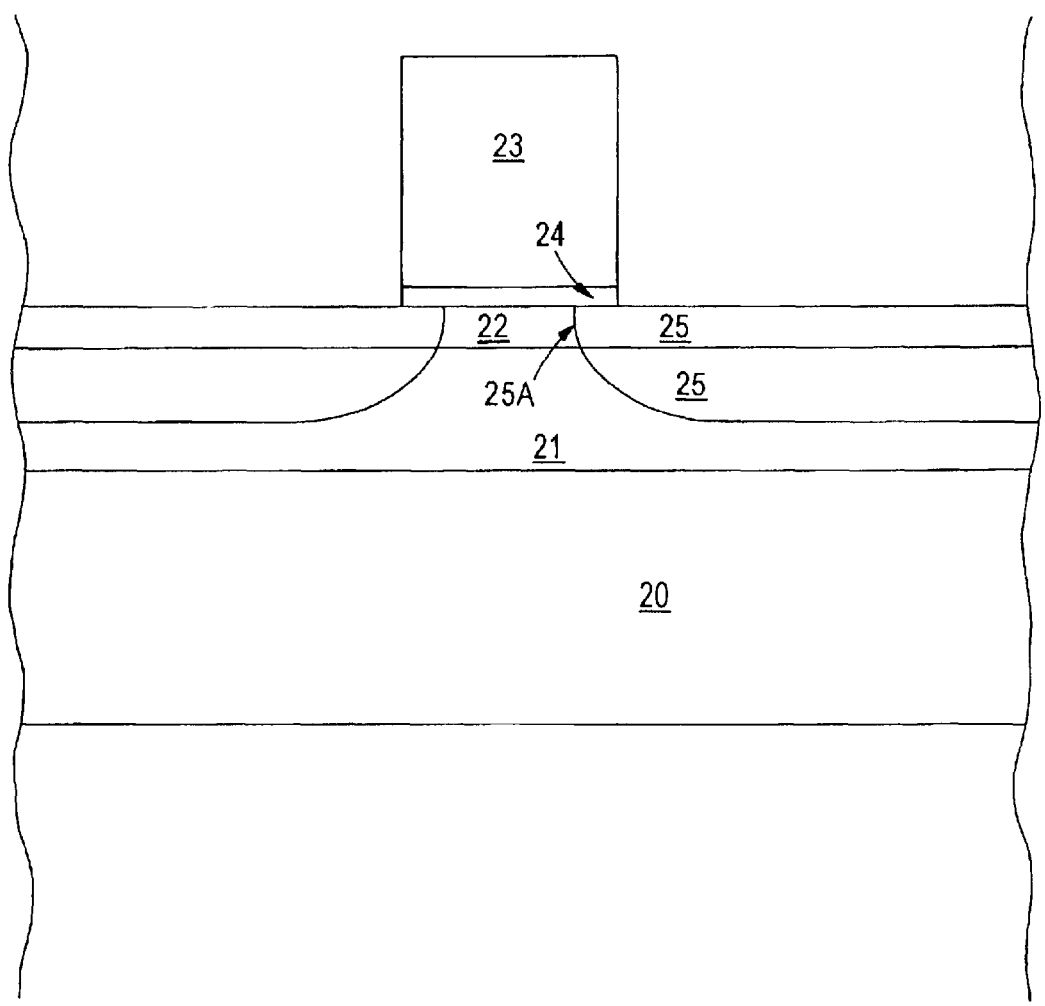
FIGS. 2 through 4 schematically illustrate sequential steps of a method in accordance with an embodiment of the present invention.
Figure 3:
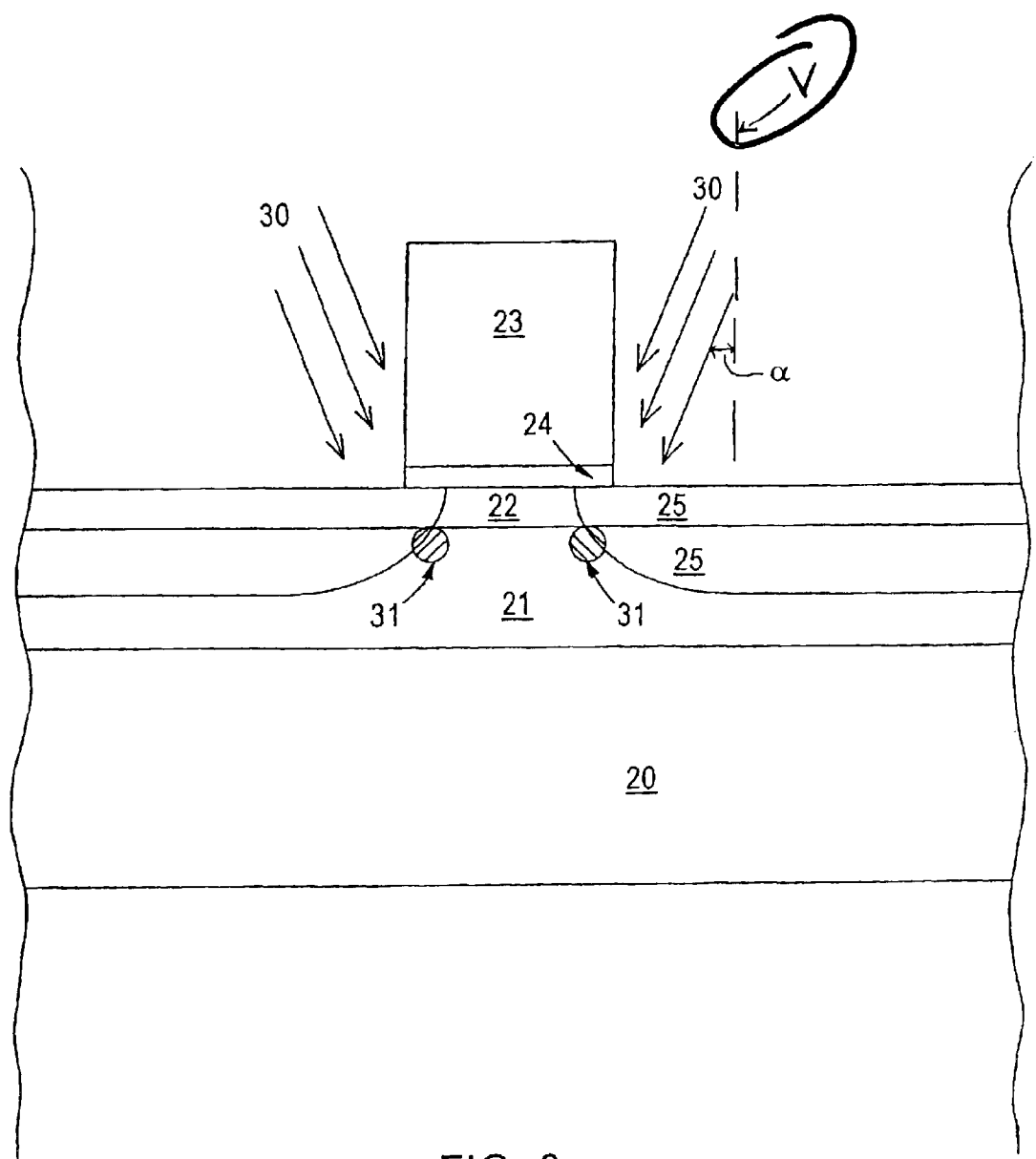
Figure 4:
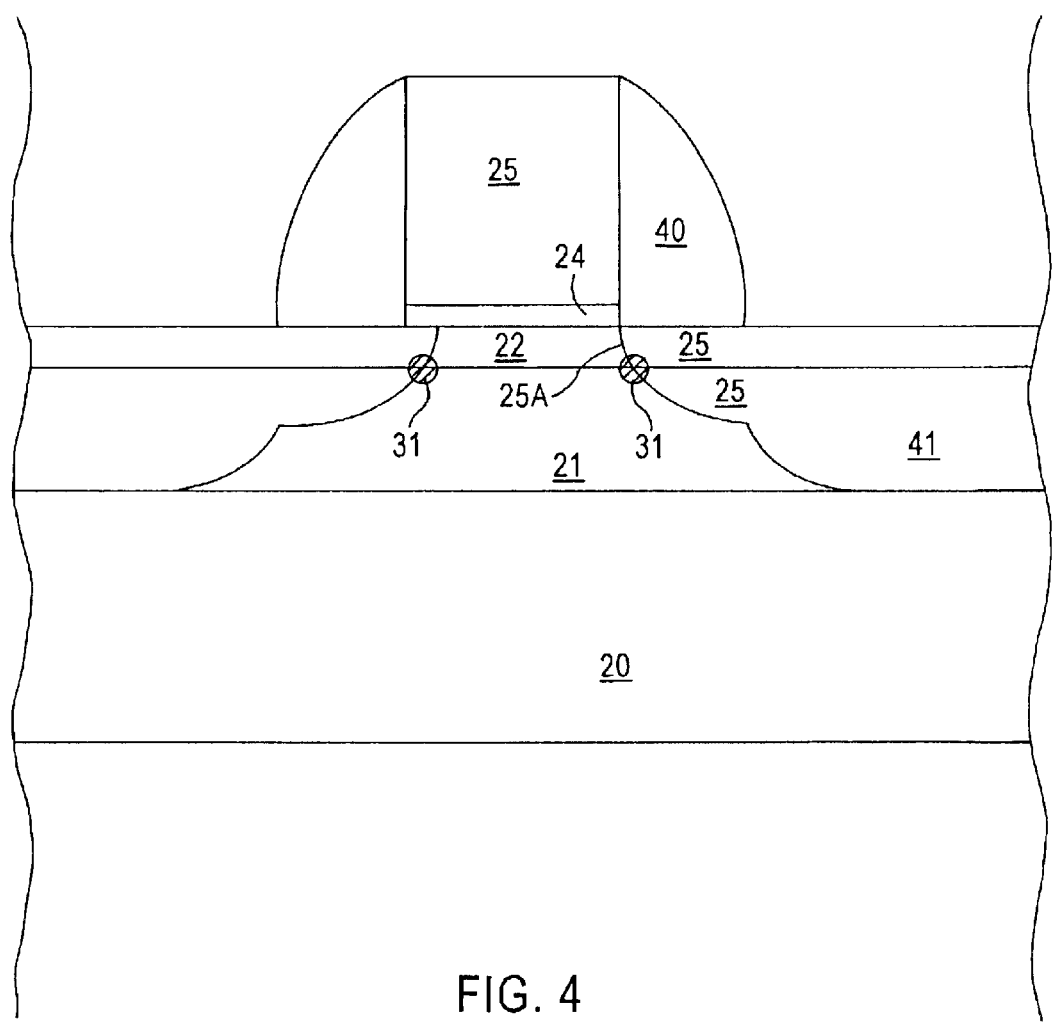

An embodiment of the present invention is schematically illustrated in FIGS. 2 through 4, wherein a strained Si-type substrate is formed comprising a Si-containing base layer 20, a layer of SiGe 21 on base layer 20, and a layer of strained Si 22 on SiGe layer 21. A gate electrode 23 is formed over the substrate with a gate dielectric layer 24. As is then ion implanted, typically at an implantation dosage of $1\times10^{14}$ to $1\times10^{15}$ ions/cm$^2$ and at an implantation energy of 2 to 8 KeV, thereby forming As source/drain extension implants 25 having a junction 25A continuous in silicon layer 25 and SiGe layer 21.

Adverting to FIG. 3, boron ions are implanted, as illustrated by arrows 30, typically at an angle α of 10° to 45° with respect to a line V perpendicular to the upper surface of the substrate, to form diffusion stop implants 31 containing boron. Such boron implantation may be conducted by implanting B at an implantation dosage of $1\times10^{13}$ to $1\times10^{14}$ ions/cm$^2$ and at an implantation energy of 10 to 20 KeV, resulting in the formation of diffusion stop implants 31 having a B concentration of $5\times10^{17}$ to $1\times10^{19}$ atoms/cm$^3$. It should be understood that implantation conditions will depend on the particular species implanted, such as $BF_2$, as well as the thickness of the layers of strained Si 22 and SiGe layer 21.

Subsequently as illustrated in FIG. 4, sidewall spacers 40, such as silicon nitride, are formed on the side surfaces of the gate electrode 25 and As implantation is implemented to form deep source/drain implants. Heating is then conducted, such as rapid thermal annealing at a temperature of 1000° C. to 1100° C. for 1 second to 10 seconds, thereby activating As source/drain extensions 25 and deep As source/drain regions 41. As illustrated in FIG. 4, the presence of boron-containing diffusion stop implants 31 effectively prevents distortion of the originally formed As source/drain extensions implant junction 25A maintaining its original profile.

The present invention provides methodology enabling the fabrication of semiconductor devices having NMOS transistors on strained Si-type substrates with As source/drain extensions having accurately defined junctions, without punch-through. The present invention enjoys industrial applicability in fabricating various types of highly miniaturized semiconductor devices with improved reliability, performance speed and reproducibility. The present invention has particular applicability in fabricating semiconductor devices with design features in the deep sub-micron regime with significantly improved reliability and high performance speed.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is susceptible of changes or modifications within the scope of the inventive concept as expressed herein.

What is claimed is:

1. A method of manufacturing a semiconductor device, the method comprising:
    forming a substrate comprising a semiconductor layer of silicon (Si) having a strained lattice on a layer of silicon-germanium (SiGe);
    forming a gate electrode, with side surfaces, on an upper surface of the substrate with a gate dielectric layer therebetween;
    ion implanting arsenic (As) into the substrate to form source/drain extension implants having junctions with the strained Si and SiGe layers under the side surfaces of the gate electrode;
    ion implanting boron impurities into the substrate at the junctions to form diffusion stop implants which inhibit diffusion of As; and
    heating to form activated As source/drain extensions, wherein the diffusion stop implants prevent As diffusion during heating.

2. The method according to claim 1, comprising ion implanting B ions or $BF_2$ ions as the boron impurities.

3. The method according to claim 2, comprising ion implanting B ions as the boron impurities.

4. The method according to claim 3, comprising ion implanting B ions at a dosage of $1\times10^{13}$ to $1\times10^{14}$ ions/cm$^2$ and at an implantation energy of 10 to 20 KeV to form the diffusion stop implants.

5. The method according to claim 4, comprising, ion implanting B at an angle of 10° to 45° with respect to a line perpendicular to the upper surface of the substrate.

6. The method according to claim 1, comprising ion implanting the boron impurities at an angle of 10° to 45° with respect to a line perpendicular to the upper surface of the substrate.

7. The method according to claim 1, comprising ion implanting As at an implantation dosage of $1\times10^{14}$ to $1\times10^{15}$ ions/cm$^2$ and at an implantation energy of 2 to 8 KeV.

8. The method according to claim 1, comprising heating at a temperature of 1,000° C. to 1,100° C. for 1 second to 10 seconds to activate the As source/drain extensions.

9. The method according to claim 1, comprising:
   forming sidewall spacers on the side surfaces of the gate electrode;
   ion implanting to form deep source/drain regions; and
   heating to activate the source/drain extensions and deep source/drain regions.

10. The method according to claim 1, comprising ion implanting boron to form the diffusion stop implants prior to ion implanting As to form the source/drain extension implants.

11. A method of manufacturing a semiconductor device, the method comprising:
   forming a substrate comprising a semiconductor layer of silicon (Si) having a strained lattice on a layer of silicon-germanium (SiGe);
   forming a gate electrode, with side surfaces, on an upper surface of the substrate with a gate dielectric layer therebetween;
   ion implanting arsenic (As) into the substrate to form source/drain extension implants each having a continuous implanted junction profile with the strained Si and SiGe layers under the side surfaces of the gate electrode;
   ion implanting boron impurities into the substrate at the junctions with the SiGe layer to form diffusion stop implants which inhibit diffusion of As in the SiGe layer; and
   heating to form activated As source/drain extensions, wherein the diffusion stop implants prevent As diffusion during heating thereby maintaining the implanted junction profiles with the strained Si and SiGe layers.

12. The method according to claim 11, comprising ion implanting B ions or $BF_2$ ions as the boron impurities.

13. The method according to claim 11, comprising ion implanting boron impurities at an angle of 10° to 45° with respect to a line perpendicular to the upper surface of the substrate.

14. The method according to claim 11, comprising:
   forming sidewall spacers on the side surfaces of the gate electrode;
   ion implanting to form deep source/drain regions; and
   heating to activate the source/drain extensions and deep source/drain regions.

15. The method according to claim 12, comprising ion implanting B ions to form the diffusion stop implants prior to ion implanting As to form the source/drain extension implants.

* * * * *